US008830100B2

(12) United States Patent
Nakamoto et al.

(10) Patent No.: US 8,830,100 B2
(45) Date of Patent: Sep. 9, 2014

(54) DIGITAL-ANALOG CONVERTER AND CONTROL METHOD THEREOF

(71) Applicant: Asahi Kasei Microdevices Corporation, Tokyo (JP)

(72) Inventors: Seiko Nakamoto, Tokyo (JP); Junya Nakanishi, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 13/996,140

(22) PCT Filed: Oct. 31, 2012

(86) PCT No.: PCT/JP2012/006996
§ 371 (c)(1),
(2), (4) Date: Jun. 20, 2013

(87) PCT Pub. No.: WO2013/124928
PCT Pub. Date: Aug. 29, 2013

(65) Prior Publication Data
US 2014/0097977 A1    Apr. 10, 2014

(30) Foreign Application Priority Data

Feb. 22, 2012 (JP) ................................. 2012-036395

(51) Int. Cl.
*H03M 1/66* (2006.01)
*H03M 1/80* (2006.01)
*H03M 1/06* (2006.01)

(52) U.S. Cl.
CPC ................ *H03M 1/806* (2013.01); *H03M 1/06* (2013.01); *H03M 1/804* (2013.01)
USPC .......................................... 341/144; 341/150

(58) Field of Classification Search
CPC ....... H03M 1/806; H03M 1/06; H03M 1/804; H03M 2201/145; H03M 2201/6157
USPC .......................... 341/150, 144, 172, 143, 122
See application file for complete search history.

(56) References Cited

U.S. PATENT DOCUMENTS 4,685,698 A * 8/1987 Klinkner et al. ........... 280/5.515
5,990,819 A   11/1999 Fujimori
(Continued)

FOREIGN PATENT DOCUMENTS

| JP | 11-122111 A | 4/1999 |
| JP | 3852721 B2 | 9/2006 |
| JP | 2011-244236 A | 12/2011 |

(Continued)

OTHER PUBLICATIONS

Written Opinion of the International Searching Authority dated Aug. 30, 2013, for the related international application No. PCT/JP2012/006996.

*Primary Examiner* — Peguy Jean Pierre
(74) *Attorney, Agent, or Firm* — Morgan, Lewis & Bockius LLP

(57) ABSTRACT

A digital-analog converter circuit includes sampling capacitive elements (111, 112, . . . , 11N) of which one ends are to be electrically connected to and disconnected from input terminals (D1, D2, . . . , DN), to which digital signals are input, via a switch unit (SWu10), an operational amplifier (501), a switch (301) capable of electrically connecting and disconnecting the other ends of the sampling capacitive elements (111, 112, . . . , 11N) and an inverting input terminal of the operational amplifier (501), and a switch unit (SWu40) that is disposed between nodes between the switch unit (SWu10) and the sampling capacitive elements (111, 112, . . . , 11N) and the output terminal of the operational amplifier (501) and capable of connecting and disconnecting them. An on-resistance value of a MOS transistor included in the switch (301) is set to be larger than an on-resistance value of a MOS transistor included in the switch unit (SWu40).

9 Claims, 17 Drawing Sheets

(56) References Cited

U.S. PATENT DOCUMENTS

| | | | |
|---|---|---|---|
| 7,598,754 B2 * | 10/2009 | Yu et al. | 324/713 |
| 7,948,309 B2 * | 5/2011 | Mak et al. | 330/98 |
| 2009/0212855 A1 * | 8/2009 | Mitchell | 327/552 |
| 2010/0066577 A1 * | 3/2010 | Huang | 341/143 |

FOREIGN PATENT DOCUMENTS

| | | |
|---|---|---|
| WO | 2011/145152 A1 | 11/2011 |

* cited by examiner

DIGITAL-ANALOG CONVERTER AND CONTROL METHOD THEREOF

TECHNICAL FIELD

The present invention relates to a digital-analog converter and a control method thereof, and more particularly, to a switched capacitor type digital-analog converter and a control method thereof.

BACKGROUND ART

In the field of audio instruments, high quality is required for signals. Accordingly, operations with high accuracy which do not cause even a small conversion error of an analog output signal are required for a digital-analog converter used for the audio instruments.

A digital-analog converter is a device that converts an input digital signal (input digital signal) into an analog signal and that outputs the converted analog signal as an analog output signal. In the digital-analog converter, a capacitive element is charged depending on a signal level of a digital input signal and an operational amplifier outputs an analog output signal depending on the charged voltage of the capacitive element. In the digital-analog converter having this configuration, a known technique for reducing a signal distortion is disclosed, for example, in Patent Document 1.

FIG. 15 is a diagram illustrating the digital-analog converter disclosed in Patent Document 1 and shows a configuration in which input signals VDin1, VDin2, ..., VDinN (where N is a natural number in the present specification) corresponding to digital data are input and an analog output signal VAout is output. The configuration shown in FIG. 15 includes capacitive elements C1, C2, ..., CN connected to input terminals D1, D2, ..., DN of the input signals corresponding to plural digital data pieces via switches S11, S12, ..., S1N. The plural capacitive elements C1, C2, ..., CN are connected to switches 2 and 3. The switch 3 is connected to an inverting input terminal of an operational amplifier 5. In the operational amplifier 5, the inverting input terminal is connected to an output terminal A via a capacitive element 6.

The capacitive elements C1, C2, ..., CN shown in FIG. 15 are sampling capacitive elements and the capacitive element 6 is an integrating capacitive element.

In the configuration shown in FIG. 15, nodes between the switches S11, S12, ..., S1N and the capacitive elements C1, C2, ..., CN are connected to the output terminal A of the operational amplifier 5. Switches S21, S22, ..., S2N are disposed between the nodes between the switches S11, S12, ..., S1N and the capacitive elements C1, C2, ..., CN and the output terminal of the operational amplifier 5.

In a period in which control signals (not shown) input to the switch unit SWu1 and the switch 2 are at a "H" level, the capacitive elements C1, C2, ..., CN are charged with capacities corresponding to signal levels of the digital input signals. After the switch unit SWu1 and the switch 2 are turned off, control signals input to the switch 3 and the switch unit SWu4 are changed to the "H" level . In this period, the capacitive elements C1, C2, ..., CN and the capacitive element 6 are connected in series to each other and the capacitive elements C1, C2, ..., CN and the output terminal A of the operational amplifier are connected. As a result, the potential of the output terminal A varies. The control signals input to the switch unit SWu1 and the switch 2 and the control signals input to the switch 3 and the switch unit SWu4 periodically vary so as to alternately repeat "H" and "L".

(a) of FIG. 16 is a diagram illustrating a state where the output terminal A is connected between the switch unit SWu1 and the capacitive elements C1, C2, ..., CN in a period in which the switch 3 and the switch unit SWu4 are turned on. Here, a resistance value (on-resistance value) when the switch unit SWu4 shown in FIG. 15 is turned on is defined as RSW4. The on-resistance value of the switch 3 shown in FIG. 15 is defined as RSW3. The capacitive elements C1, C2, ..., CN shown in FIG. 15 are collectively referred to as a sampling capacitive element unit 7.

(b) of FIG. 16 is a diagram illustrating the waveform of an analog output signal output from the output terminal shown in (a) of FIG. 16. In (b) of FIG. 16, the vertical axis represents the level of an analog signal and the horizontal axis represents the time. (c) of FIG. 16 is a partially-enlarged view illustrating the waveform of the analog output signal shown in (b) of FIG. 16.

In the digital-analog converter, MOS transistors are generally used as the switches. The on-resistance value RSW3 of the switch 3 does not vary depending on the potential of the output terminal A. However, the on-resistance value RSW4 of the MOS transistor of the switch unit SWu4 varies depending on the potential of the output terminal A which is the source or drain terminal of the MOS transistor.

CITATION LIST

Patent Document

Patent Document 1: JP 3852721

SUMMARY OF THE INVENTION

Problem to be Solved

FIG. 17 A is a diagram illustrating a relationship between the on-resistance value RSW4 of the switch unit SWu4 shown in FIG. 15 and the analog output signal VAout output from the output terminal A. In FIG. 17 A, the vertical axis represents the on-resistance value RSW4 and the horizontal axis represents the analog output signal VAout. FIG. 17 A illustrates a relationship between the analog output signal VAout and the time when the relationship between the on-resistance value RSW4 and the analog output signal VAout in the curve shown in FIG. 17 A is indicated by points a and b. It can be seen from FIG. 17 A that the analog output signal VAout varies with a constant amplitude.

FIG. 18 is a diagram illustrating a relationship between the analog output signal VAout and the time. The vertical axis represents the analog output signal VAout and the horizontal axis represents the time. Curves La and Lb shown in FIG. 18 show enlarged transient characteristics of the analog output signal VAout. The curve La of FIG. 18 represents the relationship between the analog output signal VAout and the time when the on-resistance value RSW4 of the switch unit SWu4 is indicated by the point a shown in FIG. 17 A. The curve Lb represents the relationship between the analog output signal VAout and the time when the on-resistance value RSW4 of the switch unit SWu4 is indicated by the point b shown in FIG. 17 A.

As can be clearly seen from the curves La and Lb shown in FIG. 18, when the on-resistance values of the switches used in the digital-analog converter vary, the transient characteristics vary. The variation of the transient characteristics is expressed by a shift length d formed between the curve La and the curve Lb. The variation in the transient characteristics of the analog output signal VAout appears as degradation in distortion characteristics of the digital-analog converter.

The present invention is made in consideration of the above-mentioned circumstances and an object thereof is to provide a digital-analog converter which can suppress occurrence of a distortion in an analog output signal due to a variation in on-resistance value of a switch and which has a simple circuit structure and a control method thereof.

Solution to the Problem

According to an aspect of the present invention, there is provided a digital-analog converter including: a sampling capacitive element (for example, a sampling capacitive element unit 70 shown in FIG. 1) that samples a digital signal input from the outside; an operational amplifier (for example, an operational amplifier 501 shown in FIG. 1); a summing node switch unit (for example, a switch 301 shown in FIG. 1) that is capable of electrically connecting and disconnecting one end of the sampling capacitive element and an inverting input terminal of the operational amplifier; and a feedback switch unit (for example, a switch unit SWu40 shown in FIG. 1) that is disposed between an output terminal of the operational amplifier and the other end other than the one end of the sampling capacitive element and that is capable of electrically connecting and disconnecting the output terminal of the operational amplifier and the other end of the sampling capacitive element, wherein the summing node switch unit and the feedback switch unit includes a MOS transistor, and an on-resistance value of the MOS transistor for a summing node switch included in the summing node switch unit is set to be larger than the on-resistance value of the MOS transistor for a feedback switch included in the feedback switch unit until a predetermined time elapses from a time point when the one end of the sampling capacitive element and the inverting input terminal of the operational amplifier are electrically connected to each other.

A signal for turning on the MOS transistor for the summing node switch may rise more slowly than a signal for turning on the MOS transistor for the feedback switch.

The summing node switch unit may include a plurality of the MOS transistors for the summing node switch, and a signal for turning on at least a part of the plurality of MOS transistors for the summing node switch may rise more slowly than a signal for turning on the other MOS transistors for the summing node switch.

The summing node switch unit may include a plurality of the MOS transistors for the summing node switch, and a signal for controlling the plurality of MOS transistors for the summing node switch may sequentially turn on the plurality of MOS transistors for the summing node switch at different timings.

According to another aspect of the present invention, there is provided a digital-analog converter including: a sampling capacitive element (for example, a sampling capacitive element unit 70 shown in FIG. 1) that samples a digital signal input from the outside; an operational amplifier (for example, an operational amplifier 501 shown in FIG. 1); a summing node switch unit (for example, a switch 301 shown in FIG. 1) that is capable of electrically connecting and disconnecting one end of the sampling capacitive element and an inverting input terminal of the operational amplifier; and a feedback switch unit (for example, a switch unit SWu40 shown in FIG. 1) that is disposed between an output terminal of the operational amplifier and the other end other than the one end of the sampling capacitive element and that is capable of electrically connecting and disconnecting the output terminal of the operational amplifier and the other end of the sampling capacitive element, wherein the summing node switch unit and the feedback switch unit include a MOS transistor, and an on-resistance value of the MOS transistor included in the summing node switch unit is set to be larger than the on-resistance value of the MOS transistor included in the feedback switch unit.

According to still another aspect of the present invention, there is provided a digital-analog converter including: a plurality of input terminals (for example, input terminals D1, D2, . . . , DN shown in FIG. 1) to which digital signals are input, respectively; a plurality of sampling capacitive elements (for example, sampling capacitive elements 111, 112, . . . , 11N shown in FIG. 1) that are disposed to correspond to the plurality of input terminals and that sample charges of the digital signals input from the corresponding input terminals; a plurality of first switches (for example, switches 101, 102, . . . , 10N shown in FIG. 1) that are disposed between the input terminals and the sampling capacitive elements to correspond to the plurality of input terminals and that are capable of electrically connecting the input terminals and one ends of the sampling capacitive elements; a second switch (for example, a switch 201 shown in FIG. 1) capable of electrically connecting the other ends other than the one ends of the plurality of sampling capacitive elements and a first reference voltage source; an operational amplifier (for example, an operational amplifier 501 shown in FIG. 1) that includes an inverting input terminal electrically connected to the one ends of the plurality of sampling capacitive elements, a non-inverting input terminal electrically connected to a second reference voltage source, and an output terminal outputting an analog signal; a third switch (for example, a switch 301 shown in FIG. 1) capable of electrically connecting the one ends of the plurality of sampling capacitive elements and the inverting input terminal; an integrating capacitive element (for example, an integrating capacitive element 603 shown in FIG. 1) that is disposed between the non-inverting input terminal and the output terminal of the operational amplifier and that is charged with the charges sampled by the sampling capacitive elements; and a fourth switch (for example, switches 141, 142, . . . , 14N shown in FIG. 1) that is disposed between nodes between the plurality of first switches and the sampling capacitive elements corresponding to the first switches and the output terminal and that is capable of electrically connecting the first switches and the output terminal, wherein the third switch and the fourth switch include a MOS transistor, and an on-resistance value of the third switch is larger than an on-resistance value of the fourth switch only by a predetermined time from a time point where the third switch and the fourth switch are turned on.

According to still another aspect of the present invention, there is provided a digital-analog converter including: a plurality of input terminals (for example, input terminals D1, D2, . . . , DN shown in FIG. 1) to which digital signals are input, respectively; a plurality of sampling capacitive elements (for example, sampling capacitive elements 111, 112, . . . , 11N shown in FIG. 1) that are disposed to correspond to the plurality of input terminals and that sample charges of the digital signals input from the corresponding input terminals; a plurality of first switches (for example, switches 101, 102, . . . , 10N shown in FIG. 1) that are disposed between the input terminals and the sampling capacitive elements to correspond to the plurality of input terminals and that are capable of electrically connecting the input terminals and one ends of the sampling capacitive elements; a second switch (for example, a switch 201 shown in FIG. 1) capable of electrically connecting the other ends other the one ends of the plurality of sampling capacitive elements and a first reference voltage source; an operational amplifier (for example, an operational amplifier 501 shown in FIG. 1) that includes an inverting input terminal electrically connected to the one ends of the plurality of sampling capacitive elements, a non-inverting input terminal electrically connected to a second reference voltage source, and an output terminal outputting an analog signal; a third switch (for example, a switch 301 shown in FIG. 1) capable of electrically connecting the one ends of the plurality of sampling capacitive elements and the inverting input terminal; an integrating capacitive element (for example, an integrating capacitive element 603 shown in FIG. 1) that is disposed between the non-inverting input terminal and the output terminal of the operational amplifier and that is charged with the charges sampled by the sampling capacitive elements; and a fourth switch (for example, switches 141, 142, . . . , 14N shown in FIG. 1) that is disposed between nodes between the plurality of first switches and the sampling capacitive elements corresponding to the first switches and the output terminal and that is capable of electrically connecting the first switches and the output terminal, wherein the third switch and the fourth switch include a MOS transistor, and an on-resistance value of the MOS transistor included in the third switch is larger than an on-resistance value of the MOS transistor included in the fourth switch.

According to still another aspect of the invention, there is provided a control method of a digital-analog converter including: a sampling period in which a digital signal input from the outside is sampled by a sampling capacitive element (for example, sampling capacitive elements 111, 112, . . . , 11N shown in FIG. 1); and an integrating period in which one end of the sampling capacitive element and an input terminal of an operational amplifier (for example, an operational amplifier 501 shown in FIG. 1) are electrically connected to each other by a summing node switch unit (for example, a switch 301 shown in FIG. 1) capable of electrically connecting and disconnecting the one end of the sampling capacitive element and the input terminal of the operational amplifier and a feedback switch unit (for example, a switch unit SWu40 shown in FIG. 1) capable of electrically connecting and disconnecting an output terminal of the operational amplifier and the other end of the sampling capacitive element, wherein an on-resistance value of a MOS transistor included in the summing node switch unit is set to be larger than an on-resistance value of a MOS transistor included in the feedback switch unit in an initial period of the integrating period.

The initial period may be a period until a predetermined time elapses from a time point when the one end of the sampling capacitive element and the input terminal of the operational amplifier are electrically connected to each other.

Advantageous Effects of the Invention

According to the aspects of the present invention, it is possible to provide a digital-analog converter with a simple circuit structure which can suppress occurrence of a distortion in an analog output signal due to a variation in on-resistance value of a switch.

That is, according to the aspects, for example, when the first switch and the second switch are turned on, the plural sampling capacitive elements are charged depending on the signal levels of plural bit signals constituting digital input signals. Thereafter, when the first and second switches are turned off and the third switch and the fourth switch are turned on, an electrical path is formed by the sampling capacitive elements, the integrating capacitive element, and the operational amplifier and the operational amplifier outputs a voltage corresponding to the charged voltage of the sampling capacitive elements as an analog output signal.

Here, it is assumed that RWS301 represents the on-resistance value of the MOS transistor constituting the third switch, RSW40 represents the on-resistance value of the MOS transistor constituting the fourth switch, CCi represents the capacitance value of the sampling capacitive elements, and CCs represents the capacitance value of the integrating capacitive element. In this case, the output signal exhibit transient characteristics depending on a time constant (RSW301+RSW40)×CCi×CCs/(CCi+CCs) of a serial connection of RSW301, RSW40, CCi, and CCs. Here, since RSW301 is larger than RSW40, the contribution of RSW301 in the above expression is high and the contribution of RSW40 is low. Therefore, according to the above aspects, since it is possible to suppress a variation in transient characteristics of an analog output signal due to a variation in the on-resistance value RSW40, it is possible to suppress a distortion.

The on-resistance value RSW301 of the third switch may be set to be equal to the on-resistance value RSW40 of the fourth switch or larger than the on-resistance value RSW40 only at the time of the initial motion in which the analog output signal varies greatly just after the third switch and the fourth switch are turned on. Accordingly, it is possible to prevent occurrence of a distortion in an analog output signal while retaining a response speed allowable in the digital-analog converter. As the ratio of the on-resistance value RSW301 of the third switch to the on-resistance value RSW40 of the fourth switch becomes larger, the effect of suppressing the variation in transient characteristics of the analog output signal becomes higher.

DESCRIPTION OF EMBODIMENTS

First Embodiment
(Circuit Configuration)

Figure 1:
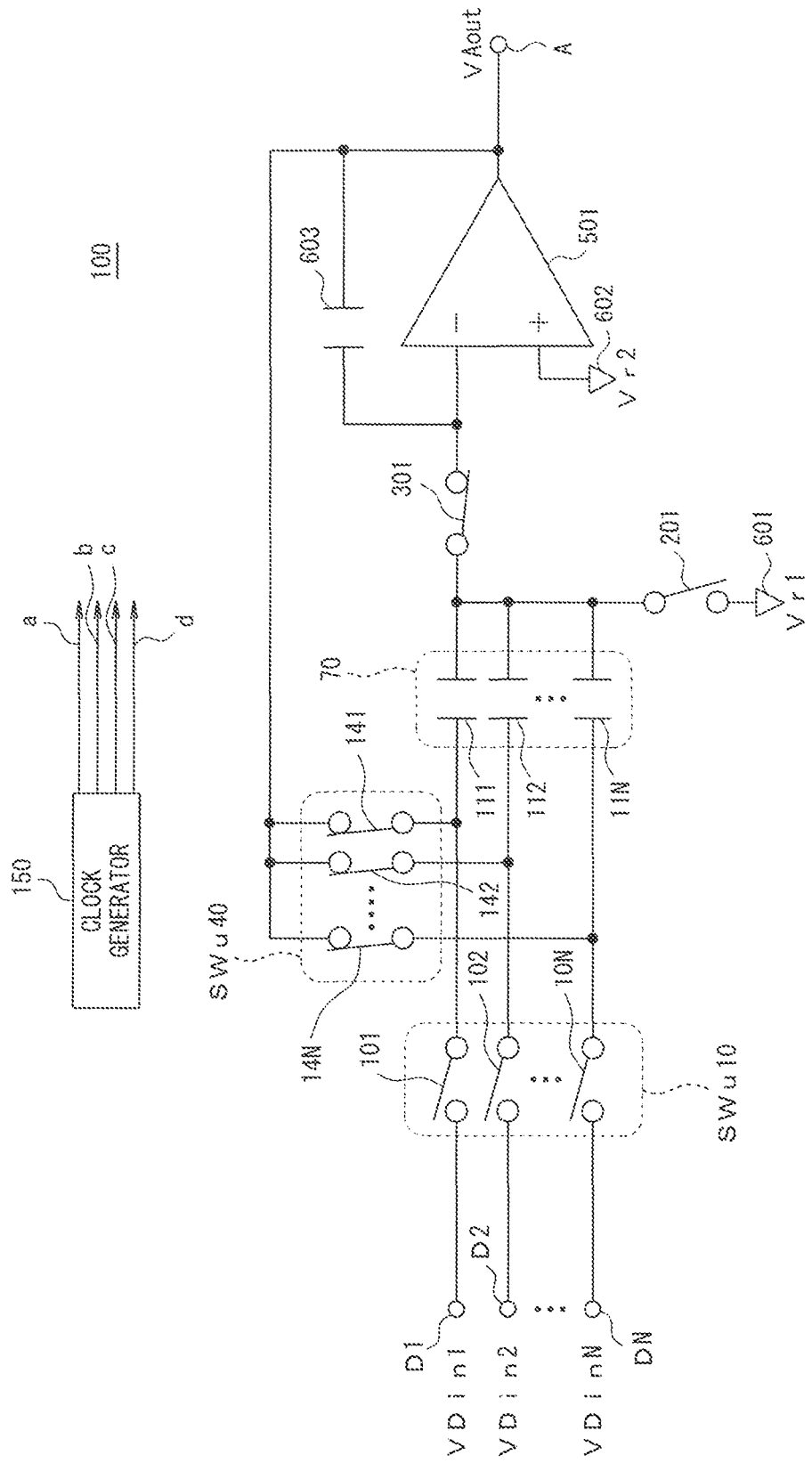
FIG. 1 is a circuit diagram illustrating a digital-analog converter according to a first embodiment of the present invention.

FIG. 1 is a circuit diagram illustrating a digital-analog converter according to a first embodiment of the present invention. In the accompanying drawings of this specification, the same elements as shown in the previously-described drawings will be referenced by the same reference numerals and description thereof will not be repeated partially.

As shown in FIG. 1, the digital-analog converter 100 according to the first embodiment is a switched capacitor type digital-analog converter. Input signals VDin1, VDin2, ..., VDinN corresponding to digital data are input to the digital-analog converter 100 and an analog output signal VAout is output therefrom. The element referenced by reference numeral 150 in FIG. 1 represents a clock generator of the digital-analog converter 100 according to the first embodiment.

The digital-analog converter 100 includes input terminals D1, D2, ..., DN to which the input signals VDin1, VDin2, ..., VDinN corresponding to digital data are input, sampling capacitive elements 111, 112, ..., 11N disposed to correspond to the input terminals D1, D2, ..., DN in a one-to-one correspondence manner, and switches 101, 102, ..., 10N. The switches 101, 102, ..., 10N are disposed between the input terminals D1, D2, DN and the sampling capacitive elements 111, 112, ..., 11N corresponding to the input terminals D1, D2, DN, respectively.

The sampling capacitive elements 111, 112, ..., 11N may have the same capacitance (CS1=CS232 ... =CSN). The capacitance may be set to $CS_i=2^{i-1} \cdot CS$ ($i-1$) so that the capacitance ratio of the sampling capacitive elements 111, 112, ..., 11N is a binary ratio ($2^{i-1}$).

A switch 301 and a switch 201 are connected to the sampling capacitive elements 111, 112, ..., 11N, the switch 201 connects and disconnects the sampling capacitive elements 111, 112, ..., 11N to and from a power source 601, and the power source 601 applies a reference voltage Vr1 to the sampling capacitive elements 111, 112, ..., 11N.

The digital-analog converter 100 includes an operational amplifier 501. The switch 301 electrically connects and disconnects the inverting input terminal of the operational amplifier 501 to and from the sampling capacitive elements 111, 112, ..., 11N. The switch 301 connected to the inverting input terminal is also referred to as a summing node switch in this specification.

A power source 602 is connected to the non-inverting input terminal of the operational amplifier 501 and a reference voltage Vr2 is applied to the non-inverting input terminal from the power source 602. The output terminal of the operational amplifier 501 is connected to the output terminal A of the digital-analog converter 100 and outputs an analog output signal VAout. The reference voltage Vr1 and the reference voltage Vr2 may be equal to each other.

An integrating capacitive element 603 is disposed between the output terminal and the inverting input terminal of the operational amplifier 501. The output terminal of the operational amplifier 501 is connected to nodes between the switches 101, 102, ..., 10N and the sampling capacitive elements 111, 112, ..., 11N. Switches 141, 142, ..., 14N are disposed between the output terminal of the operational amplifier 501 and the nodes between the switches 101, 102, ..., 10N and the sampling capacitive elements 111, 112, ..., 11N. The switches 141, 142, ..., 14N feeding back the analog output signal VAout from the output terminal of the operational amplifier 501 to the nodes between the switches 101, 102, ..., 10N and the sampling capacitive elements 111, 112, ..., 11N are also referred to as feedback switches in this specification.

In this configuration, it is assumed that all the switches are constructed by a MOS transistor. The switches 101, 102, ..., 10N constitute a switch unit SWu10. The switches 141, 142, ..., 14N constitute a switch unit SWu40. The sampling capacitive elements 111, 112, ..., 11N constitute a sampling capacitive element unit 70.

The switch units SWu10 and SWu40, the switch 201, and the switch 301 are turned on and off in response to control signals a to d generated by the clock generator 150. At this time, the switches 101, 102, ..., 10N included in the switch unit SWu10 are turned on and off at the same time, and the on-resistance value RSWu10 when the switches 101, 102, ..., 10N are turned on is a combined value of the on-resistance values of the switches 101, 102, ..., 10N. The switches 141, 142, ..., 14N included in the switch unit SWu40 are turned on and off at the same time, and the on-resistance value RSWu40 when the switches 141, 142, ..., 14N are turned on is a combined value of the on-resistance values of the switches 141, 142, ..., 14N.

The on-resistance value of the MOS transistor constituting the switch 301 is defined as RSW301 and the on-resistance value of the switch 201 is defined as RSW201. The on-resistance value of the MOS transistors constituting the switch unit SWu40 is defined as RSW40. The on-resistance value RSW301 is set to be larger than the on-resistance value RSW40.

In the digital-analog converter 100 shown in FIG. 1, the numbers of switches (N where N is a natural number) included in the input terminals D1, D2, ..., DN, the sampling capacitive elements 111, 112, ..., 11N, and the switch units SWu10 and SWu40 are set to the same value.

Figure 2:
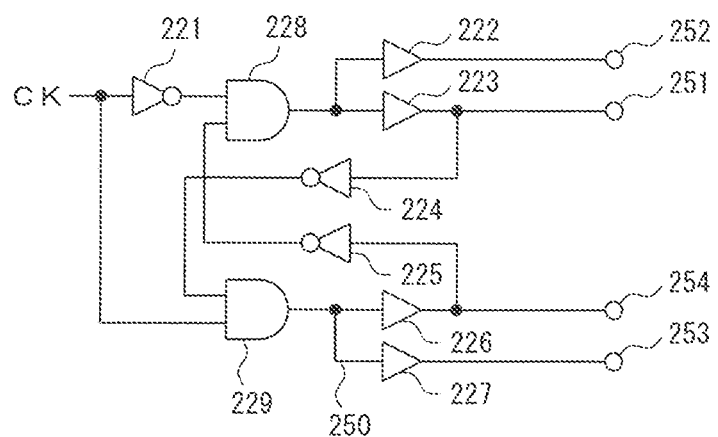
FIG. 2 is a diagram illustrating a specific circuit configuration of a clock generator shown in FIG. 1.

FIG. 2 is a diagram illustrating a specific circuit configuration of the clock generator 150 shown in FIG. 1. As shown in FIG. 2, the clock generator 150 includes three inverters 221, 224, and 225, four buffers 222, 223, 226, and 227, and AND circuits 228 and 229. The terminal 251 of the clock generator 150 outputs the control signal a which is input to the switch unit SWu10. The terminal 252 outputs the control signal b which is input to the switch 201, the terminal 253 outputs the control signal c which is input to the switch 301, and the terminal 254 outputs the control signal d which is input to the switch unit SWu40. Reference numeral 250 in FIG. 2 represents a node of the clock generator 150.

When a clock CK input to the clock generator 150 is changed from "L" to "H", the control signal a output from the terminal 251 and the control signal b output from the terminal 252 are changed to "L" immediately. Thereafter, when the clock CK is changed from "H" to "L", the control signal c output from the terminal 253 and the control signal d output from the terminal 254 are changed from "H" to "L" immediately and are changed from "L" to "H" later.

(Operation)

The sampling capacitive elements 111, 112, ..., 11N sample the input signals VDin1, VDin2, ..., VDinN corresponding to digital data input from the input terminals D1, D2, ..., DN, and are charged with the input signals VDin1, VDin2, ..., VDinN corresponding to the digital data. The input signals VDin1, VDin2, ..., VDinN corresponding to the digital data are bit signals, and the sampling capacitive elements 111, 112, ..., 11N are charged up to the reference voltage Vr1 depending on the signal level (the voltage Vref⁺ or Vref⁻) of the bit signals.

By turning on the switch unit SWu10 and the switch 201, the sampling capacitive elements 111, 112, ..., 11N are charged up to the reference voltage Vr1 depending on the levels of the digital signals input from the input terminals D1, D2, ..., DN. The period in which the switch unit SWu10 and the switch 201 are turned on is referred to as a first period. Subsequently, the switch unit SWu10 and the switch 201 are turned off and the switch 301 and the switch unit SWu40 are turned on. At this time, the analog output signal VAout output from the output terminal A varies on the basis of the charged voltages of the sampling capacitive elements 111, 112, ..., 11N. The period in which the switch 301 and the switch unit SWu40 are turned on is referred to as a second period. The first period and the second period are alternately switched periodically.

Figure 3:
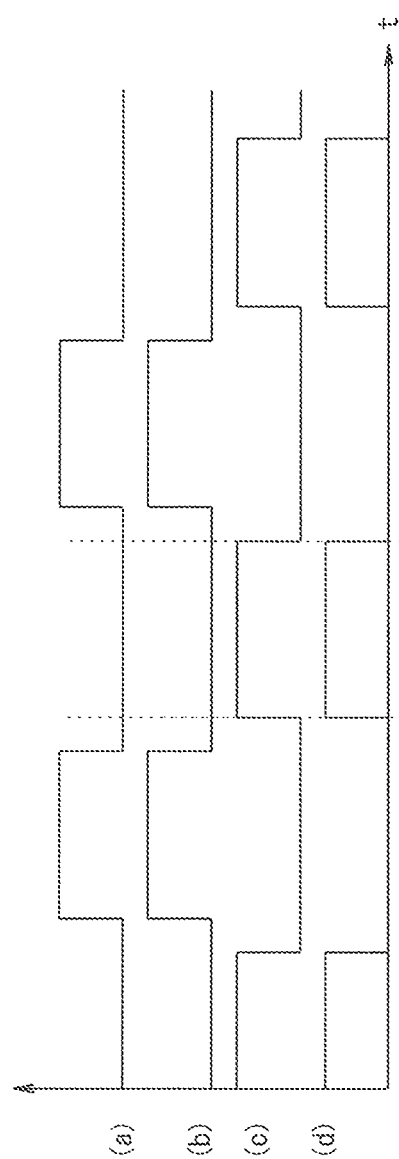
FIG. 3 is a diagram illustrating waveforms of control signals input to switches shown in FIG. 1.

(a) to (d) of FIG. 3 are diagrams illustrating waveforms of the control signals a to d input to the switches shown in FIG. 1. In (a) to (d) of FIG. 3, the vertical axis represents "H" or "L" which is the level of the control signals and the horizontal axis represents the time. (a) of FIG. 3 shows the waveform of the control signal a input to the switch unit SWu10. (b) of FIG. 3 shows the waveform of the control signal b input to the switch 201, (c) of FIG. 3 shows the waveform of the control signal c input to the switch 301, and (d) of FIG. 3 shows the waveform of the control signal d input to the switch unit SWu40. The switches included in the switch units SWu10 and SWu40 and the switches 201 and 301 are all turned on when the control signals are at the "H" level, and are all turned off when the control signals are at the "L" level.

As described above, the period in which the switch unit SWu10 and the switch 201 are turned on is defined as the first period, and the period in which the switch 301 and the switch unit SWu40 are turned on is defined as the second period.

The digital-analog converter 100 according to the first embodiment constitutes a direct transmission type digital-analog converter. The digital-analog converter 100 may first perform a delta-sigma modulation on a digital input signal and then perform a digital-analog conversion thereon.

Figure 4:
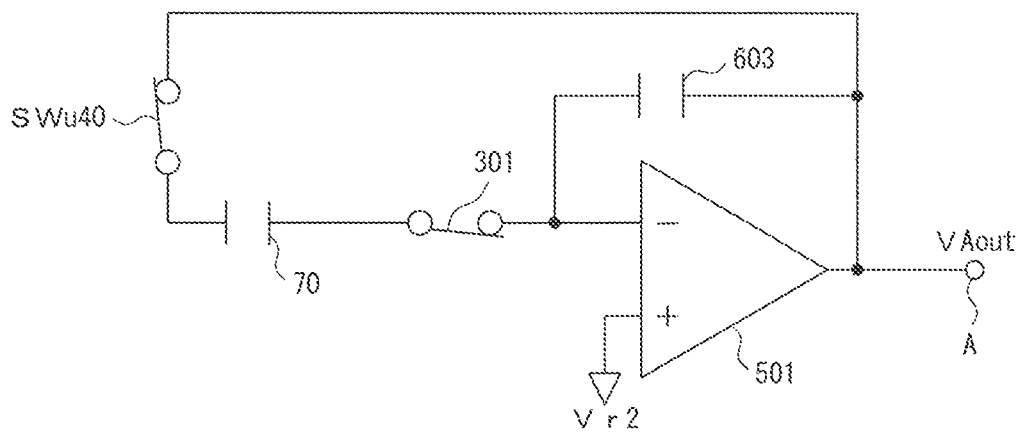
FIG. 4 is a diagram illustrating a state of a second period of the digital-analog converter shown in FIG. 1.

FIG. 4 is a diagram illustrating the state of the second period of the digital-analog converter 100 shown in FIG. 1, that is, a state where the switch 301 and the switch unit SWu40 are turned on. At this time, the switch 301, the switch unit SWu40, the sampling capacitive elements 111, 112, ..., 11N, and the integrating capacitive element 603 are connected in series to form a closed loop. The time constant of the close loop is expressed by Expression 1. The analog output signal VAout exhibits transient characteristics depending on the time constant of the closed loop.

In Expression 1, RSW301 represents the on-resistance value of the MOS transistor constituting the switch 301, RSW40 represents the on-resistance value of the MOS transistors of the switch unit SWu40, CCi represents the capacitance value of the sampling capacitive element unit 70, and CCs represents the capacitance value of the integrating capacitive element 603.

$$(RSW301+RSW40) \times CCi \times CCs/(CCi+CCs) \quad \text{Expression 1}$$

The on-resistance value RSW40 of the MOS transistors constituting the switch unit SWu40 will be described below.

The MOS transistors constituting the switch unit SWu40 has a characteristic (voltage dependency of the on-resistance value) that the resistance value thereof varies depending on the variation in voltage between the gate terminal as a control terminal and the source terminal or the drain terminal as a main terminal. Therefore, in the first embodiment, in the second period in which the switch unit SWu40 is turned on, the source terminals and the drain terminals of the MOS transistors constituting the switch unit SWu40 have the potential of the analog output signal VAout. Accordingly, the on-resistance value of the MOS transistors varies depending on the potential of the analog output signal VAout.

On the other hand, the potentials of the source terminal and the drain terminal of the MOS transistor constituting the switch 301 does not vary depending on the level of the analog output signal VAout. Accordingly, the on-resistance value RSW301 of the MOS transistor constituting the switch 301 is constant in the second period.

As described above, the time constant of the closed loop formed by the switch 301, the switch unit SWu40, the sampling capacitive elements 111, 112, ..., 11N, and the integrating capacitive element 603 is expressed by Expression 1. Here, since the on-resistance value RSW40 varies depending on the analog output signal VAout, the time constant of the closed loop also varies depending on the analog output signal VAout. This variation is a reason of the distortion of the analog output signal VAout.

However, in the first embodiment, the on-resistance value RSW301 having a constant value regardless of the analog output signal VAout is set to be larger than the on-resistance value RSW40. Accordingly, the contribution of the on-resistance value RSW301 in Expression 1 expressing the time constant of the closed loop is high and the contribution of the on-resistance value RSW40 is low.

Figure 5:
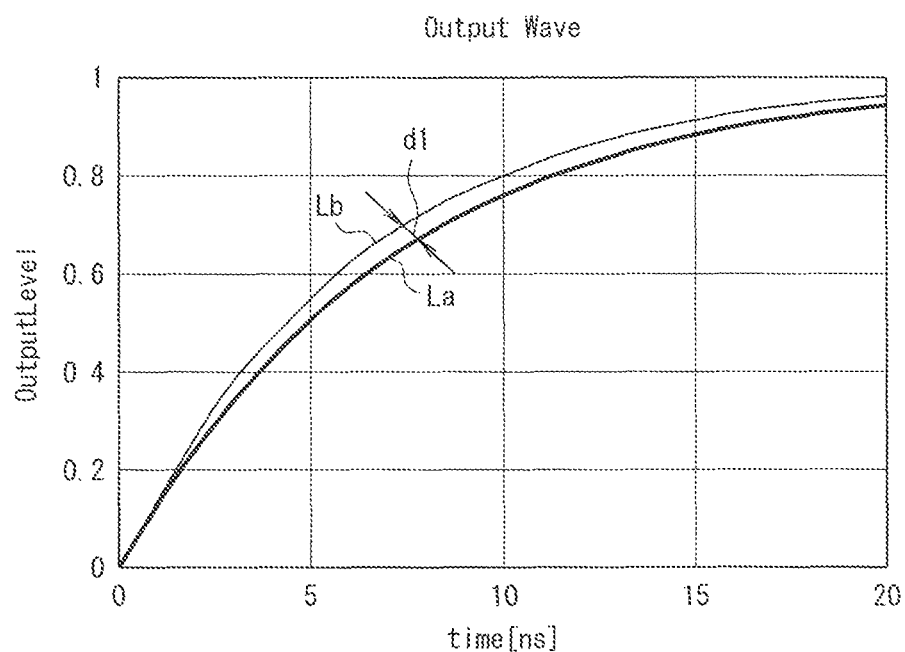
FIG. 5 is a diagram illustrating the relationship between an analog output signal VAout and the time in the first embodiment.

FIG. 5 is a diagram illustrating a relationship between the analog output signal VAout and the time in the first embodiment. The vertical axis represents the analog output signal VAout and the horizontal axis represents the time. Curves La and Lb shown in FIG. 5 represent the transient characteristics of the analog output signal VAout when the on-resistance value RSW40 have different values.

Figure 18:
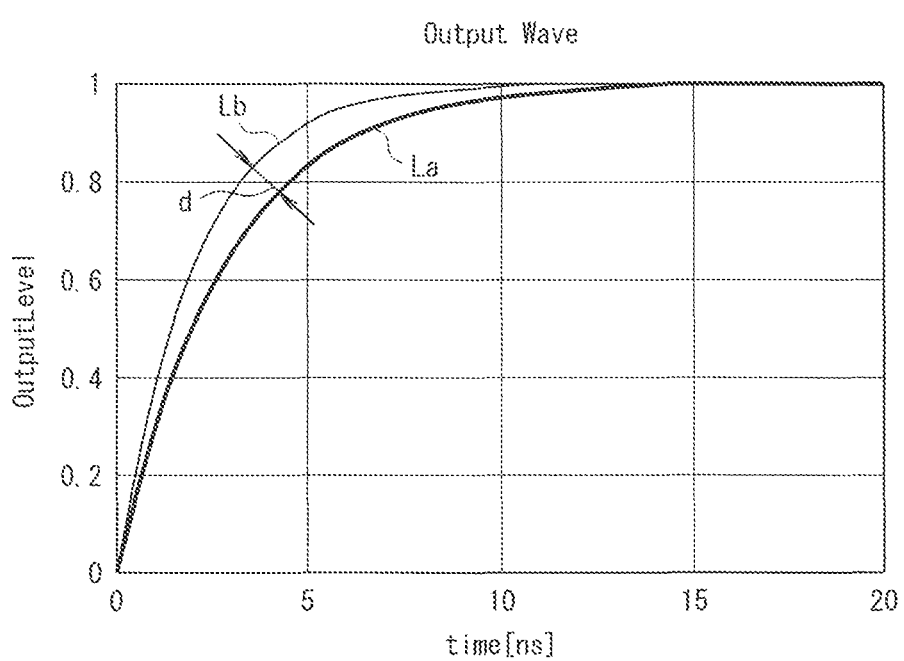
FIG. 18 is a diagram illustrating a relationship between the analog output signal shown in FIG. 15 and the time.

As can be clearly seen from the curve La and the curve Lb shown in FIG. 5, the shift length dl formed between the curve La and the curve Lb is smaller than the shift length d formed between the curve La and the curve Lb of the known digital-analog converter 100 shown in FIG. 18. Therefore, according to the first embodiment, it is possible to suppress the variation in transient characteristics of the analog output signal due to the variation of the on-resistance value RSW40 and to suppress the occurrence of a distortion. In the first embodiment, it is not necessary to newly add a new element for realizing this configuration.

In this embodiment, the integrating capacitive element 603 may not be disposed between the output terminal of the operational amplifier 501 and the inverting input terminal. In this case, the summing node switch 301 maybe replaced with a resistor and the resistance value of the replaced resistor may be set to larger than the on-resistance value RSW40.

Regarding the rising order of the control signals c and d, the control signal c may first rise and then the control signal d may rise. Alternatively, the control signal d may first rise and then the control signal c may rise.

In this embodiment, the on-resistance value can be set arbitrarily using various methods. For example, the mobility of carriers in the MOS transistor may be set to be high so as to set the on-resistance value thereof to be small, or the mobility of carriers may be set to be low so as to set the on-resistance value thereof to be large. Alternatively, the size of the MOS transistor may be set to be large so as to set the on-resistance value to be small, or the size of the MOS transistor may be set to be small so as to set the on-resistance value thereof to be large. Alternatively, the well voltage of the MOS transistor may be controlled to set the on-resistance value thereof to an arbitrary value.

Second Embodiment

A second embodiment of the present invention will be described below.

(Circuit Configuration)

The circuit configuration of a digital-analog converter according to a second embodiment is the same as in the first embodiment and thus description thereof will not be repeated. The second embodiment is different from the first embodiment, in that the rising of the control signal input to the switch 301 shown in FIG. 1 is slower than that in the first embodiment. The digital-analog converter according to the second embodiment is different from that of the first embodiment only in the configuration of the clock generator 650. Accordingly, only the configuration of the clock generator 650 is shown in FIG. 6 and the other configuration of the digital-analog converter will not be shown and will not be described.

Figure 6:
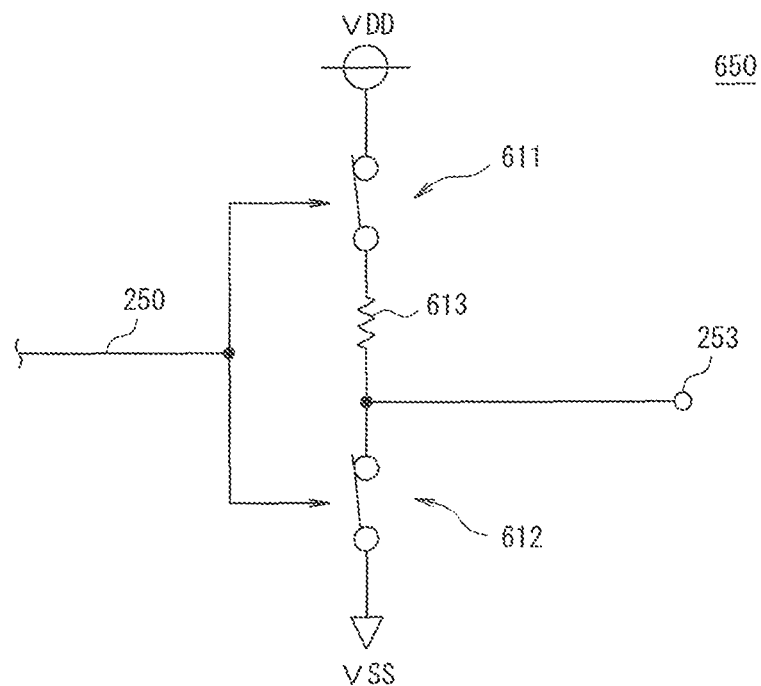
FIG. 6 is a diagram illustrating a configuration of a clock generator according to a second embodiment of the present invention.

FIG. 6 is a diagram illustrating the configuration of the clock generator 650 in the second embodiment. As shown in the drawing, the clock generator 650 includes switches 611 and 612 connected in series between reference power sources VDD and VSS and a resistive element 613 between the switch 611 and the terminal 253. Reference numeral 250 shown in FIG. 6 represents the node 250 of the clock generator 150 shown in FIG. 2, and the terminal 253 corresponds to the terminal 253 shown in FIG. 2. That is, the switches 611 and 612 shown in FIG. 6 are connected between the node 250 and the terminal 253 shown in FIG. 2. In other words, the clock generator 650 in the second embodiment has a configuration in which the buffer 227 of the clock generator 150 in the first embodiment is replaced with the clock generator 650 shown in FIG. 6.

(Operation)

Figure 7:
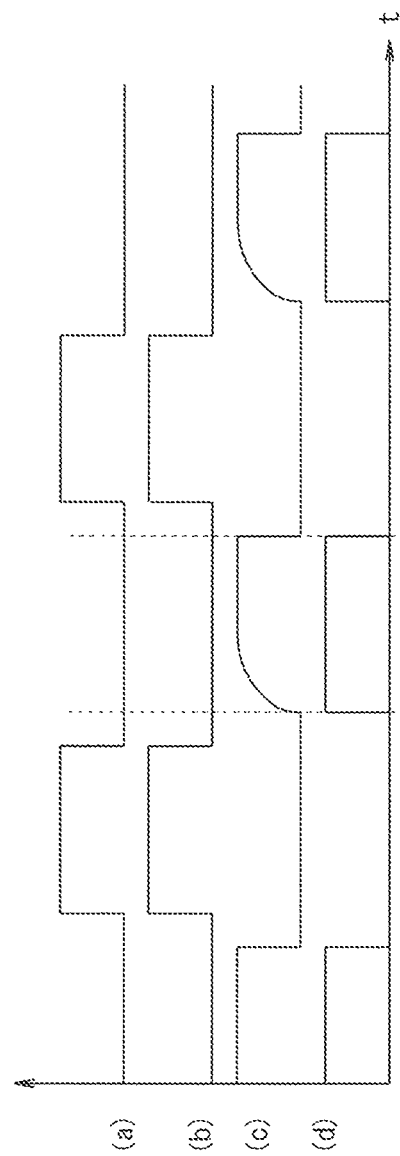
FIG. 7 is a diagram illustrating waveforms of control signals input to the switches shown in FIG. 1 in the second embodiment of the present invention.

(a) to (d) of FIG. 7 are diagrams illustrating waveforms of the control signals a to d input to the switches shown in FIG. 1. In (a) to (d) of FIG. 7, the vertical axis represents "H" or "L" which is the level of the control signals and the horizontal axis represents the time. (a) of FIG. 7 shows the waveform of the control signal input to the switch unit SWu10. (b) of FIG. 7 shows the waveform of the control signal input to the switch 201, (c) of FIG. 7 shows the waveform of the control signal input to the switch 301, and (d) of FIG. 7 shows the waveform of the control signal input to the switch unit SWu40. The switches included in the switch units SWu10 and SWu40 and the switches 201 and 301 are all turned on when the control signals are at the "H" level, and are all turned off when the control signals are at the "L" level.

As can be clearly seen from (c) of FIG. 7, in the second embodiment, the control signal input to the switch 301 rises more slowly than that in the first embodiment. Accordingly, in the second embodiment, the on-resistance value RSW301 can be set to be larger than the on-resistance value RSW40 only at the time of initial motion (only until a predetermined time elapses from a time point where the switch 301 is turned on) of the digital-analog converter in which the analog output signal VAout greatly varies.

Figure 8:
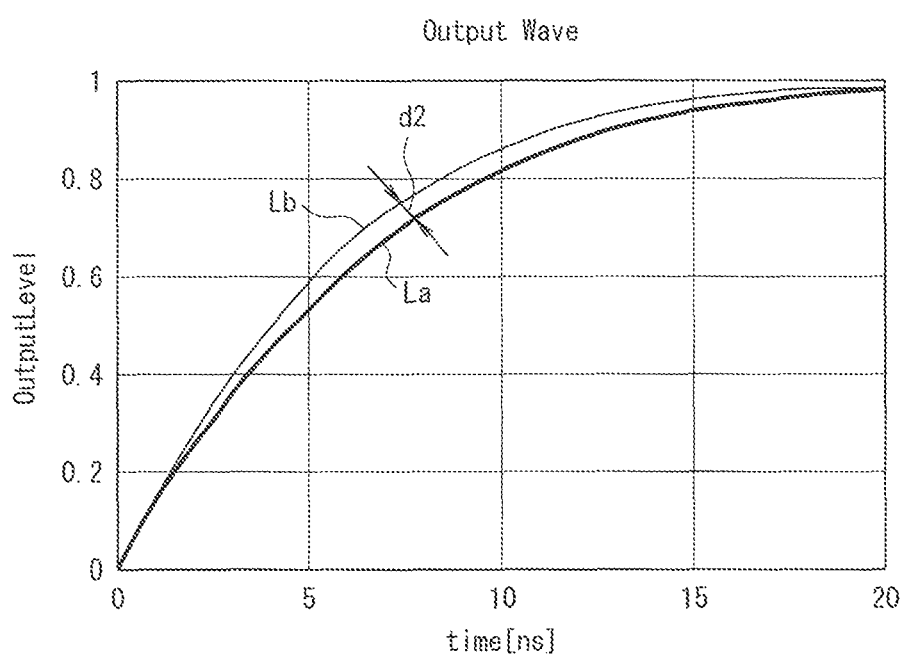
FIG. 8 is a diagram illustrating the relationship between an analog output signal VAout and the time in the second embodiment of the present invention.

FIG. 8 is a diagram illustrating a relationship between the analog output signal VAout and the time in the second embodiment. In FIG. 8, the vertical axis represents the analog output signal VAout and the horizontal axis represents the time. Curves La and Lb shown in FIG. 8 represent the transient characteristics of the analog output signal VAout when the on-resistance value RSW40 has different values.

Figure 16A:
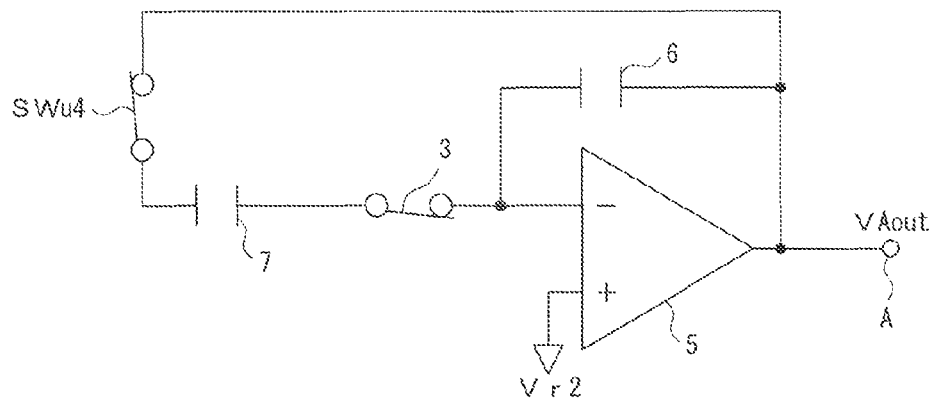
FIG. 16 is a diagram illustrating a state of the digital-analog converter shown in FIG. 15.
Figure 16B:
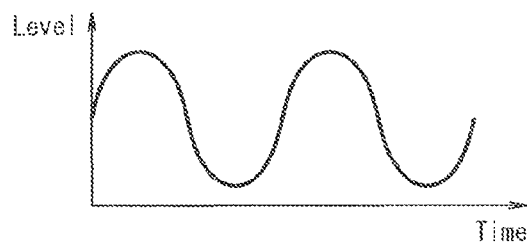
Figure 16C:
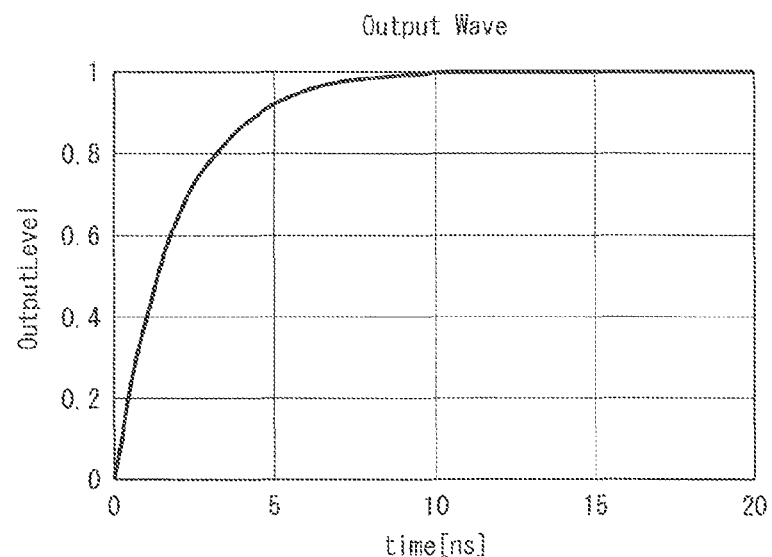
Figures 17A, 17B:
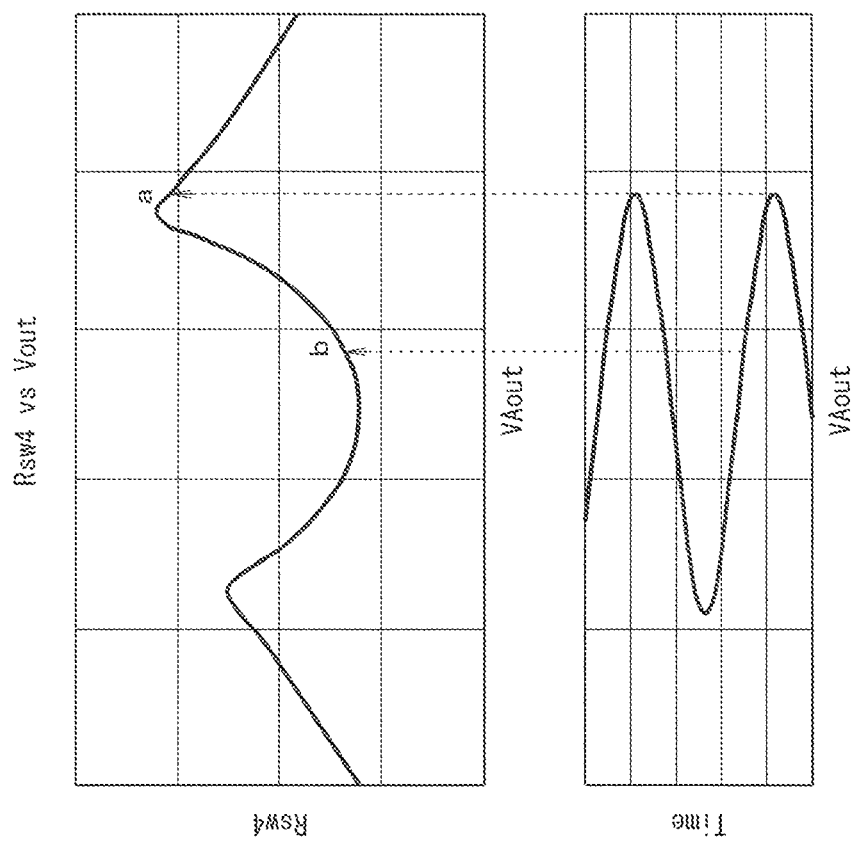
FIG. 17A is a diagram illustrating a relationship between an on-resistance value of a switch unit shown in FIG. 15 and an analog output signal.
FIG. 17B is a diagram illustrating a relationship between an on-resistance value of a switch unit shown in FIG. 15 and an analog output signal.

As can be clearly seen from the curve La and the curve Lb shown in FIG. 8, the shift length d2 formed between the curve La and the curve Lb is smaller than the shift length d formed between the curve La and the curve Lb of the known digital-analog converter 100 shown in FIG. 16. Therefore, according to the second embodiment, it is possible to suppress the variation in transient characteristics of the analog output signal due to the variation of the on-resistance value RSW40 and to suppress the occurrence of a distortion.

In the second embodiment, since the on-resistance value RSW301 is set to be large only at the time of the initial motion of the digital analog converter, it is not necessary to increase the size of the switch. Accordingly, in the second embodiment, it is possible to maintain the response speed allowable in the digital-analog converter. In the second embodiment, an increase in noise source due to an increase in switch size does not occur. Accordingly, in the second embodiment, it is possible to suppress occurrence of a distortion without increasing the circuit scale of the digital-analog converter.

Regarding the control signals shown in (c) and (d) of FIG. 8, the control signal shown in (c) of FIG. 8 may first rise and then the control signal shown in (d) of FIG. 8 may rise. The control signal shown in (d) of FIG. 8 may first rise and then the control signal shown in (c) of FIG. 8 may rise.

Third Embodiment

A third embodiment of the present invention will be described below.

(Circuit Configuration)

Figure 9:
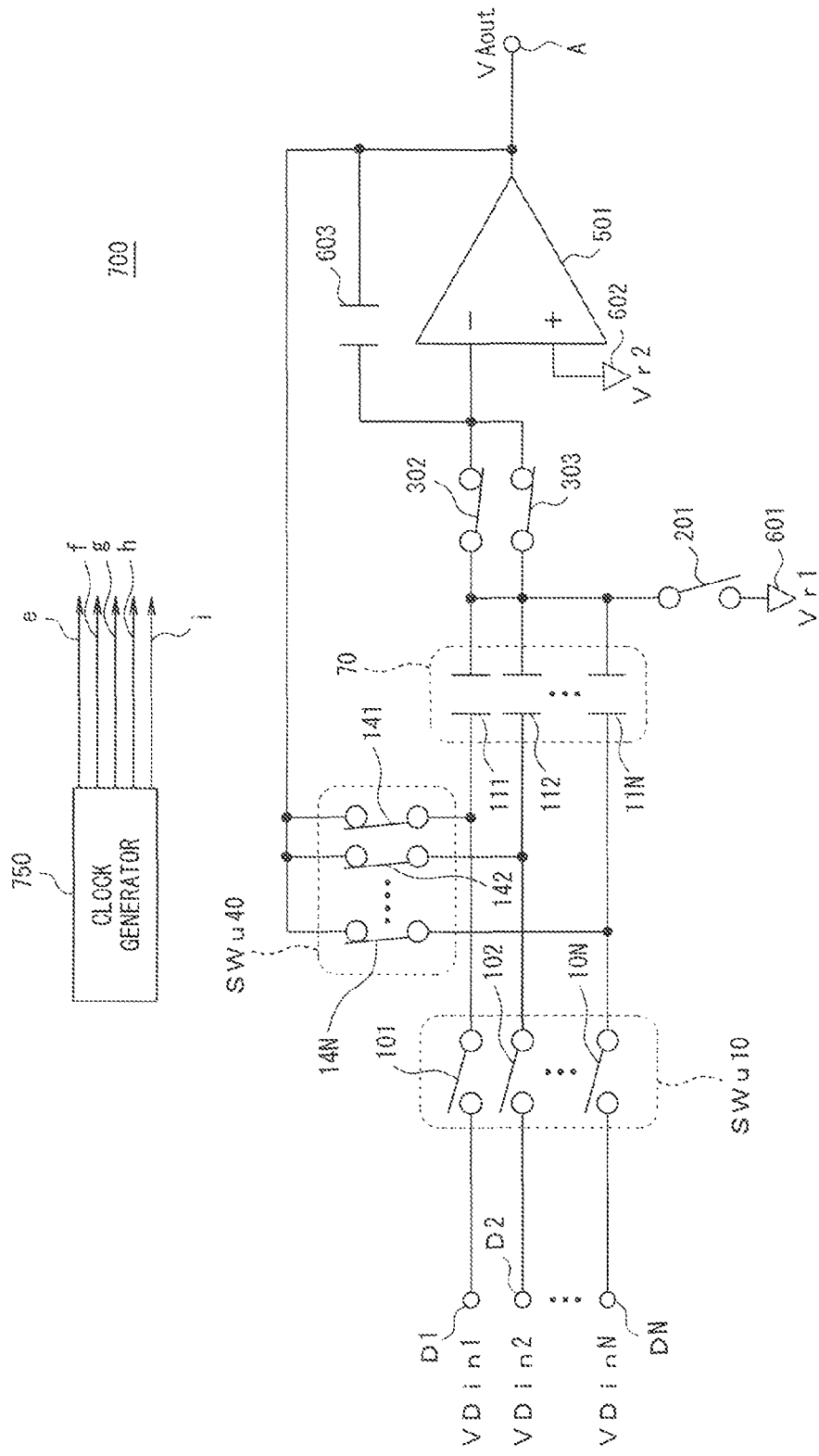
FIG. 9 is a circuit diagram illustrating a digital-analog converter according to a third embodiment of the present invention.

FIG. 9 is a diagram illustrating a digital-analog converter according to the third embodiment. In FIG. 9, an element referenced by reference numeral 700 is the digital-analog converter according to the third embodiment. The digital-analog converter 700 according to the third embodiment includes a clock generator 750 instead of the clock generator 150 in the digital-analog converter according to the first embodiment shown in FIG. 1.

The digital-analog converter 700 according to the third embodiment shown in FIG. 9 includes two switches 302 and 303 instead of the switch 301 in the digital-analog converter 100 according to the first embodiment. An area occupied by the MOS transistor included in the switch 301 of the first embodiment is equal to the total area occupied by the MOS transistor constituting the switch 302 according to the second embodiment and the MOS transistor constituting the switch 303. The size ratio of the MOS transistors constituting the two switches 302 and 303 can be arbitrarily determined.

By employing this configuration, in the third embodiment, the individual sizes of the MOS transistors included in the switches 302 and 303 can be reduced to easily set the on-resistance value RSW301 at the time of turning on the switches 302 and 303 at which the analog output signal VAout greatly varies to be higher than the on-resistance value RSW40. Accordingly, in the third embodiment, it is possible to suppress the variation in transient characteristics of the analog output signal VAout due to the variation in the on-resistance value RSW40 and thus to suppress the occurrence of a distortion thereof.

The switch units SWu10 and SWu40 and the switches 201, 302, and 303 shown in FIG. 9 can perform an ON/OFF operation in response to control signals e, f, g, h, and i output from the clock generator 750.

Figure 10:
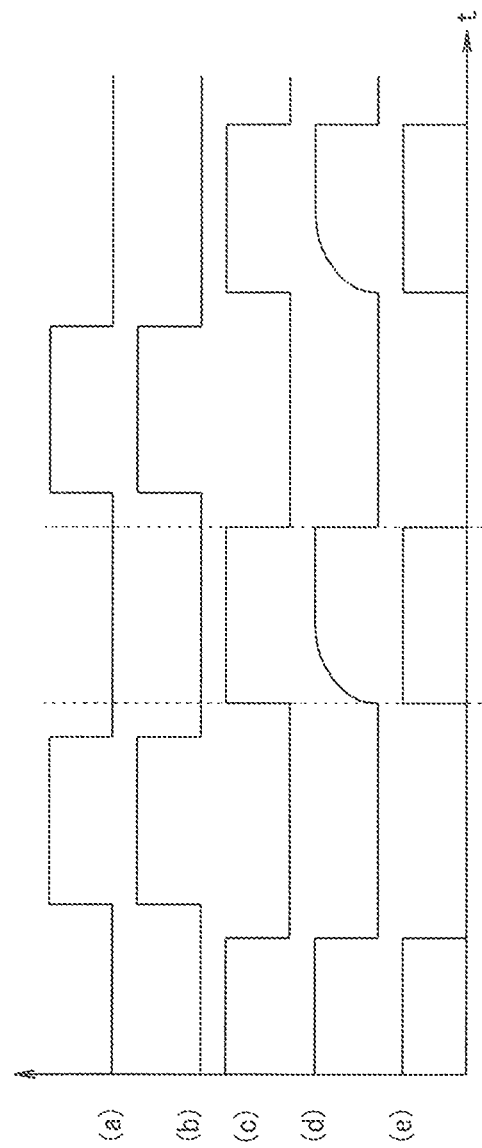
FIG. 10 is a diagram illustrating waveforms of control signals input to switches in the third embodiment of the present invention.

(a) to (e) of FIG. 10 are diagrams illustrating waveforms of the control signals e to i input to the switch units SWu10 and SWu40 and the switches 201, 302, and 303 according to the third embodiment. In (a) to (e) of FIG. 10, the vertical axis represents "H" or "L" which is the level of the control signals and the horizontal axis represents the time. (a) of FIG. 10 shows the waveform of the control signal e input to the switch unit SWu10. (b) of FIG. 10 shows the waveform of the control signal f input to the switch 201, (c) of FIG. 10 shows the waveform of the control signal g input to the switch 302, (d) of FIG. 10 shows the waveform of the control signal h input to the switch 303, and (e) of FIG. 10 shows the waveform of the control signal i input to the switch unit SWu40. The switches included in the switch units SWu10 and SWu40 and the switches 201, 302 and 303 are all turned on when the control signals are at the "H" level, and are all turned off when the control signals are at the "L" level.

As shown in (d) of FIG. 10, in the third embodiment, the control signal h for turning on the switch 303 rises more slowly than the control signal input to the other switches at the time point at which the switch 303 is turned on. By employing this configuration, the on-resistance value RSW301 obtained by combining the on-resistance values of the switches 302 and 303 can be set to be large at the time of the initial motion until a predetermined time elapses after the time point at which the switches 302 and 303 are turned on. Accordingly, in the third embodiment, it is possible to keep the response speed allowable in the digital-analog converter 700 while reducing the sizes of the switches 302 and 303. Accordingly, an increase in noise source due to the increase in switch size does not occur. According to the third embodiment, it is possible to suppress the occurrence of a distortion without increasing the circuit scale.

The "predetermined time" is a time determined depending on the size of the switches 302 and 303 and the magnitudes of the control signals thereof or the time necessary for the rising thereof. This time is an item determined to have an appropriate value at the time of designing the digital-analog converter 700.

Regarding the rising order of the control signals g, h, and i shown in (c), (d), and (e) of FIG. 10, the control signals may rise in the order of g, h, and i or the control signals may rise in the order of i, g, and h.

Fourth Embodiment

A fourth embodiment of the present invention will be described below.

(Circuit Configuration)

Figure 11:
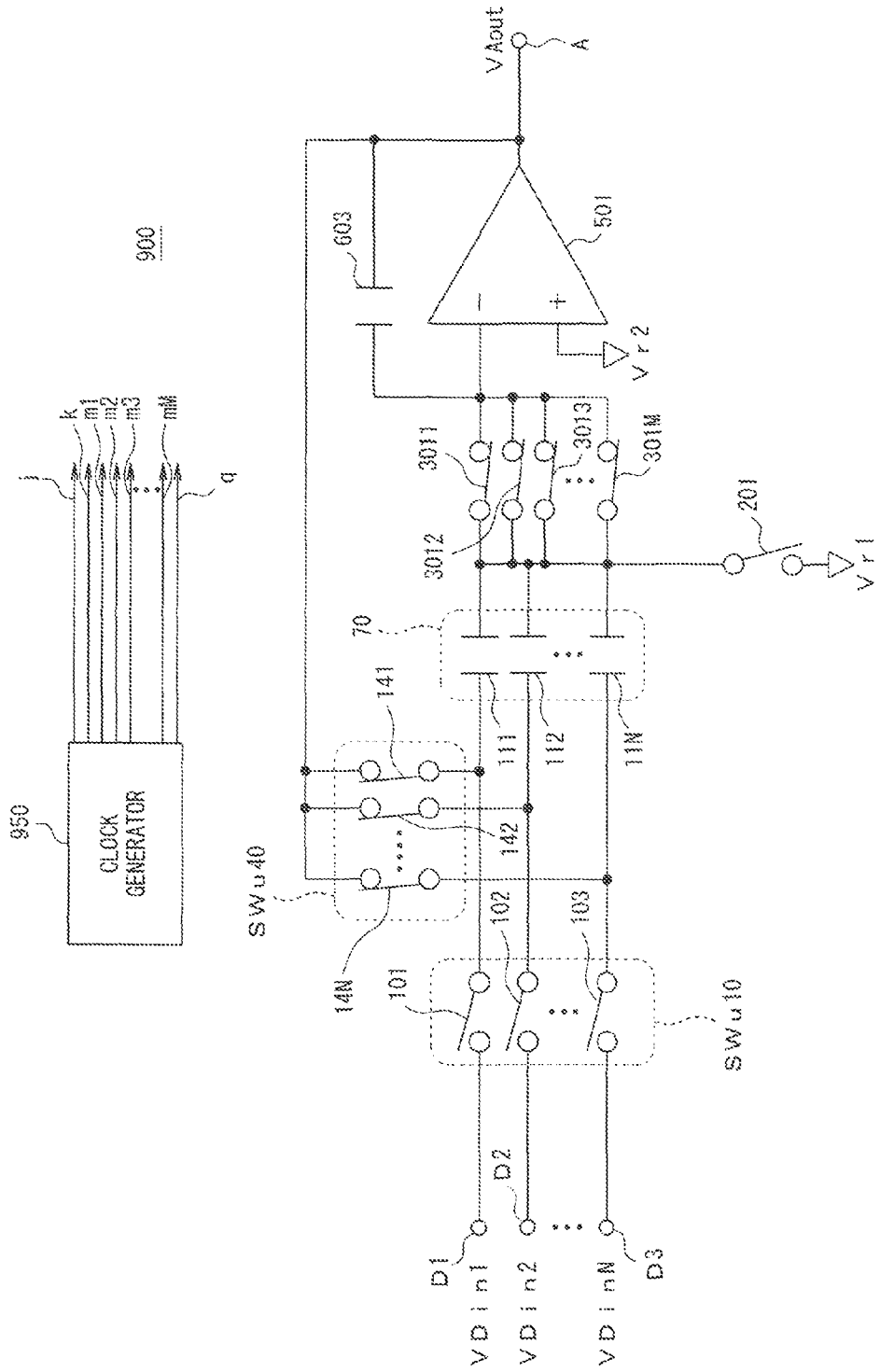
FIG. 11 is a diagram illustrating a digital-analog converter according to a fourth embodiment of the present invention.

FIG. 11 is a diagram illustrating a digital-analog converter according to the fourth embodiment of the present invention. In FIG. 11, an element referenced by reference numeral 900 is a digital-analog converter. The digital-analog converter 900 according to the fourth embodiment includes a clock generator 950 instead of the clock generator 150 in the digital-analog converter according to the first embodiment shown in FIG. 1.

The digital-analog converter 900 according to the fourth embodiment includes plural switches 3011, 3012, . . . , 301M instead of the switch 301 shown in FIG. 1. The switches 3011, 3012, . . . , 301M (where M is a natural number different from N) do not correspond to the sampling capacitive elements 111, 112, . . . , 11N in a one-to-one manner. The area occupied by the MOS transistor constituting the switch 301 in the first embodiment is equal to the total area occupied by the MOS transistors constituting the switches 3011 to 301M. The size ratio of the MOS transistors constituting the switches 3011 to 301M is assumed to be determined arbitrarily.

The switch units SWu10 and SWu40, the switch 201, and the switches 3011 to 301M shown in FIG. 11 can perform an ON/OFF operation in response to control signals j, k, m1 to mM, and q output from the clock generator 950.

Figure 12:
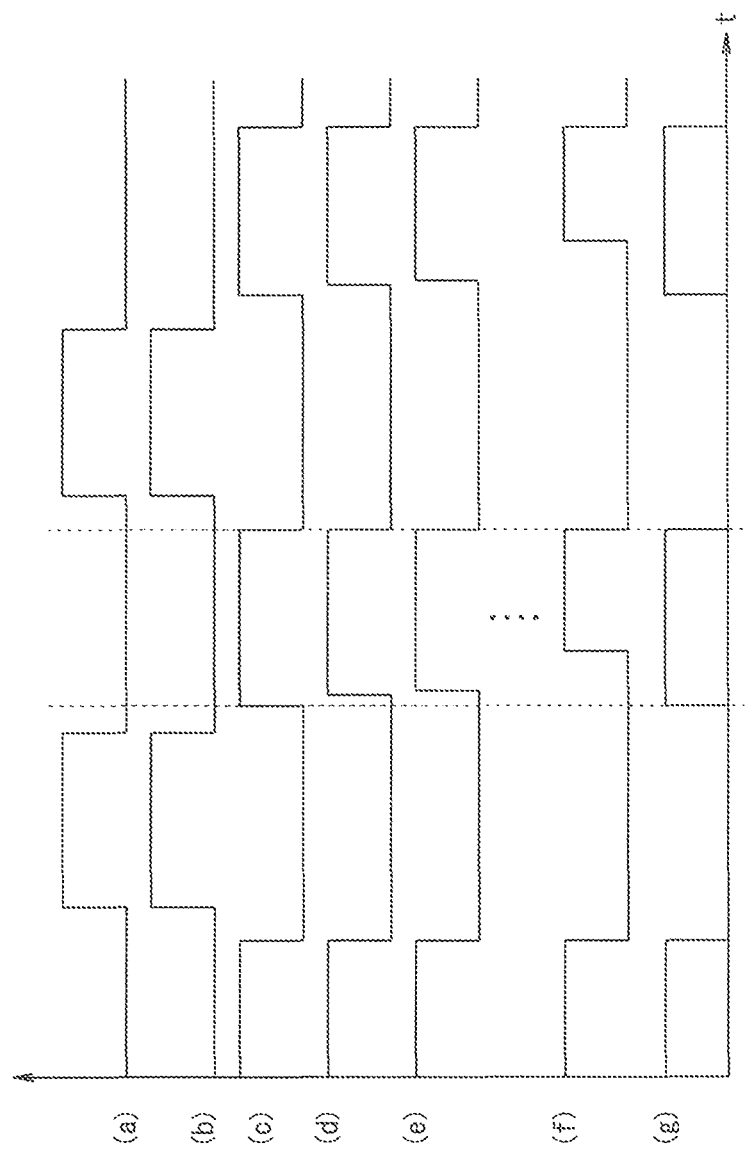
FIG. 12 is a diagram illustrating waveforms of control signals input to switches in the fourth embodiment of the present invention.

(a) to (g) of FIG. 12 are diagrams illustrating waveforms of the control signals j to q input to the switch units SWu10 and SWu40, the switch 201, and the switches 3011, 3012, . . . , 301M according to the fourth embodiment. In (a) to (e) of FIG. 12, the vertical axis represents "H" or "L" which is the level of the control signals and the horizontal axis represents the time. (a) of FIG. 12 shows the waveform of the control signal j input to the switch unit SWu10. (b) of FIG. 12 shows the waveform of the control signal k input to the switch 201, (c) of FIG. 12 shows the waveform of the control signal m1 input to the switch 3011, (d) of FIG. 12 shows the waveform of the control signal m2 input to the switch 3012, (e) of FIG. 12 shows the waveform of the control signal m3 input to the switch 3013, (f) of FIG. 12 shows the waveform of the control signal mM input to the switch 301M, and (g) of FIG. 12 shows the waveform of the control signal q input to the switch unit SWu40. The switches included in the switch units SWu10 and SWu40 and the switches 201 and 3011 to 301M are all turned on when the control signals are at the "H" level, and are all turned off when the control signals are at the "L" level.

As shown in (c) to (g) of FIG. 12, the control signals of which the timings of change to "H" are sequentially shifted slightly are input to the switches 3011 to 301M. By employing this operation, the on-resistance value RSW301 at the time of the initial motion of the digital-analog converter 900 according to the fourth embodiment of which the analog output signal greatly varies can be set to be larger than the on-resistance value RSW40.

According to the fourth embodiment, it is possible to suppress the variation in transient characteristics of the analog output signal due to the variation of the on-resistance value RSW40 and to suppress the occurrence of a distortion. In the fourth embodiment, since the on-resistance value RSW301 can be temporarily set to be large only at the time of the initial motion, it is possible to maintain the response speed allowable in the digital-analog converter 900 without increasing the size of the MOS transistors constituting the switches. It is possible to suppress occurrence of a distortion without increasing the noise source due to an increase in switch size and without increasing the circuit scale.

Fifth Embodiment

A fifth embodiment of the present invention will be described below.

(Circuit Configuration)

Figure 13:
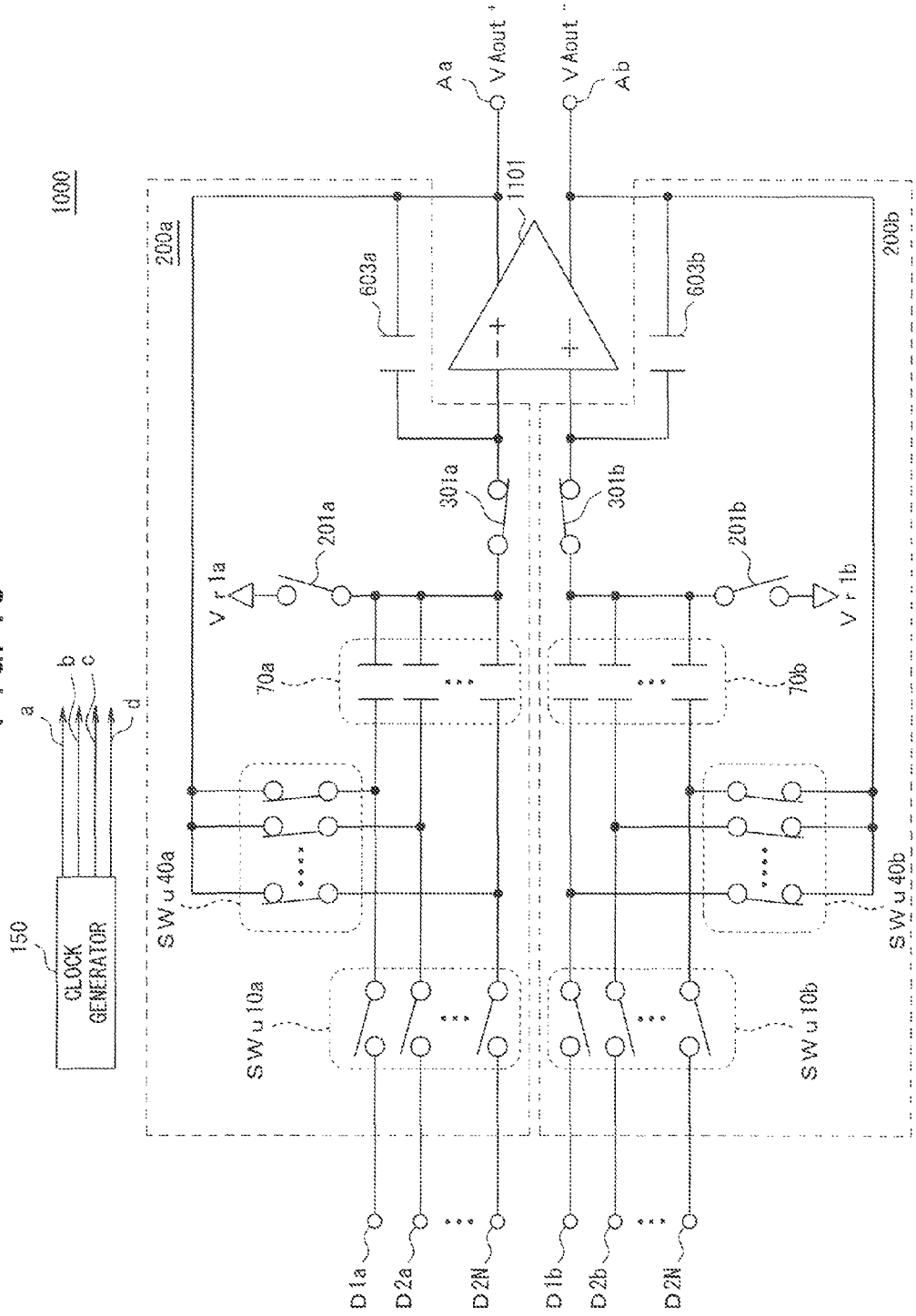
FIG. 13 is a diagram illustrating a digital-analog converter according to a fifth embodiment of the present invention.

FIG. 13 is a diagram illustrating a digital-analog converter 1000 according to the fifth embodiment of the present invention. The digital-analog converter 1000 according to the fifth embodiment is different from the digital-analog converter according to the first embodiment, in that a differential operational amplifier 1101 is provided instead of the operational amplifier 501 in the digital-analog converter according to the first embodiment shown in FIG. 1. The same charged voltages as in the first embodiment are input to two input terminals of the differential operational amplifier 1101.

More specifically, the digital-analog converter 1000 according to the fifth embodiment has a configuration in which two configurations (the switch units SWu10 and SWu40, the switch 201, the switch 301, the sampling capacitive element unit 70, and the integrating capacitive element 603) shown in FIG. 1 are connected to the differential operational amplifier 1101. In the fifth embodiment, the switch units SWu10 and SWu40, the switch 201, the switch 301, the sampling capacitive element unit 70, and the integrating capacitive element 603 shown in FIG. 1 are referred to as a digital-analog conversion section 200. Two digital-analog conversion sections 200 are referred to as digital-analog conversion sections 200*a* and 200*b*, respectively. In FIG. 13, the elements included in the digital-analog conversion section 200*a* are described with a added to the reference numerals. The elements included in the digital-analog conversion section 200*b* are described with b added to the reference numerals. The digital-analog converter 1000 according to the fifth embodiment includes a clock generator 150. The clock generator 150 has the same functional configuration as the clock generator 150 of the digital-analog converter according to the first embodiment.

In the digital-analog conversion section 200*a* and the digital-analog conversion section 200*b*, bit signals VDin1, VDin2, . . . , VDinN constituting the input signals corresponding to the digital data are sampled by the sampling capacitive elements included in the switch unit SWu10*a* or the switch unit SWu10*b*. A non-inverted analog output signal VAout$^+$ is output from the non-inverting output terminal of the differential operational amplifier 1101. The charged voltages of the sampling capacitive elements are input to the non-inverting input terminal of the differential operational amplifier 1101 in response to the same bit signals as the inverting input terminal by the same configuration as in the first embodiment, and an inverted analog output signal VAout$^-$ is output from the inverted output terminal of the differential operational amplifier.

Figure 14:
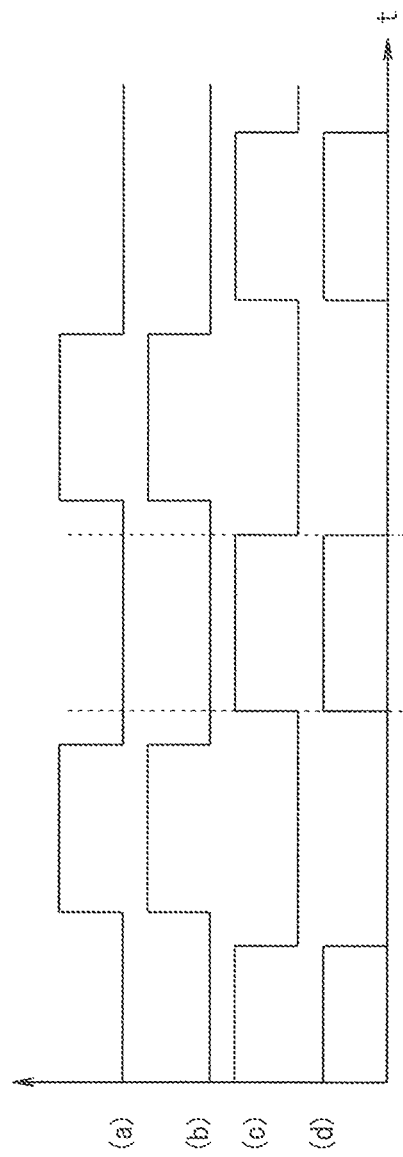
FIG. 14 is a diagram illustrating waveforms of control signals input to switches in the fifth embodiment of the present invention.
Figure 15:
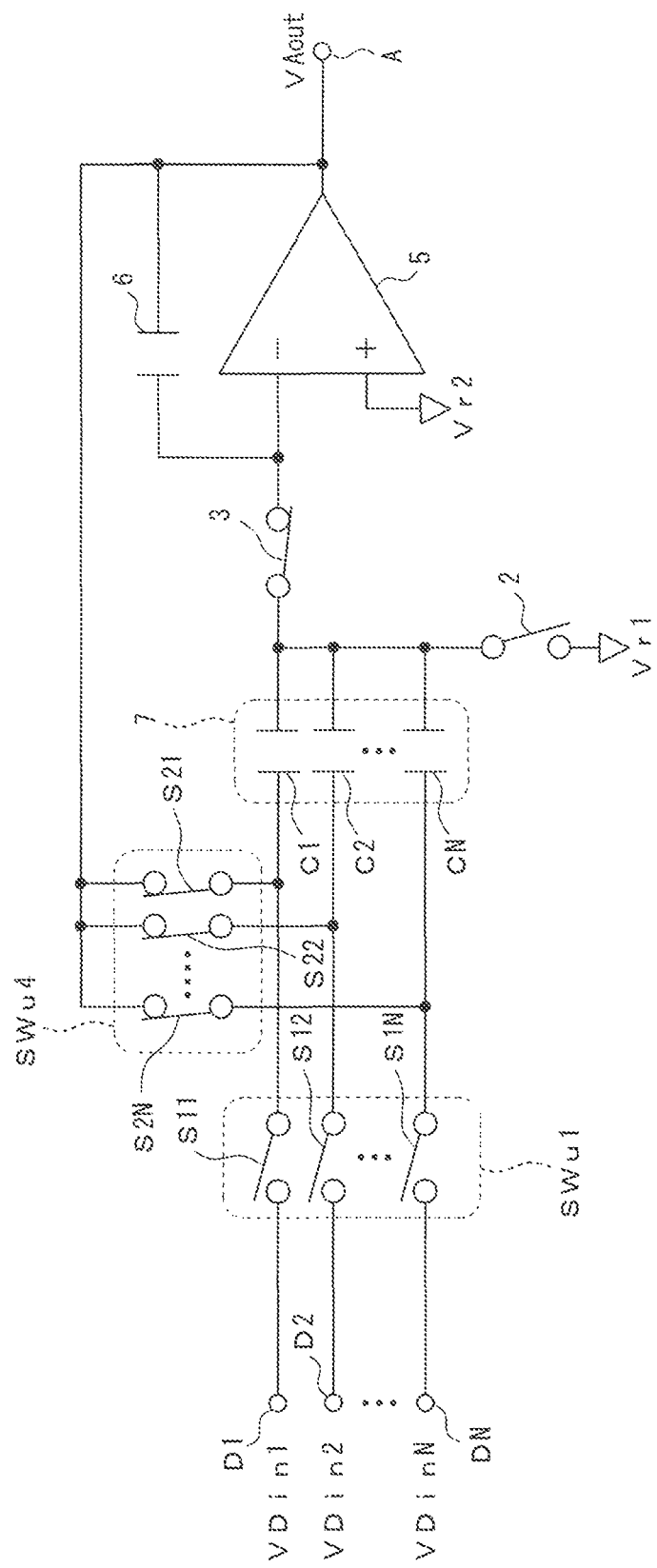
FIG. 15 is a diagram illustrating a digital-analog converter described in Patent Document 1.

(a) to (d) of FIG. 14 are diagrams illustrating waveforms of the control signals a to d input to the switch unit SWu10*a*, the switch unit SWu10*b*, the switch unit SWu40*a*, the switch unit SWu40*b*, and the switches 201*a*, 201*b*, 301*a*, and 301*b* according to the fifth embodiment. In (a) to (d) of FIG. 12, the vertical axis represents "H" or "L" which is the level of the control signals and the horizontal axis represents the time. (a) of FIG. 12 shows the waveform of the control signal a input to the switch unit SWu10*a* and the switch unit SWu10*b*. (b) of FIG. 12 shows the waveform of the control signal b input to the switches 201*a* and 201*b*, (c) of FIG. 12 shows the waveform of the control signal c input to the switches 301*a* and 301*b*, and (d) of FIG. 12 shows the waveform of the control signal d input to the switch unit SWu40*a* and the switch unit SWu40*b*. The switches included in the switch unit SWu10*a*, the switch unit SWu10*b*, the switch unit SWu40*a*, and the switch unit SWu40*b* and the switches 201*a*, 201*b*, 301*a*, and 301*b* are all turned on when the control signals are at the "H" level, and are all turned off when the control signals are at the "L" level.

In this way, in the fifth embodiment, by constructing a completely differential digital-analog converter 1000, it is possible to remove in-phase noise and to perform a digital-analog conversion with higher accuracy. In the fifth embodiment, the on-resistance value of the switch 301*a* is defined as RSW301*a*, the on-resistance value of the switch 301*b* is defined as RSW301*b*, the on-resistance value of the switch unit SWu40 is defined as RSW40*a*, and the on-resistance value of the switch unit SWu40*b* is defined as RSW40*b*. At this time, since the on-resistance value RSW301*a* is set to be larger than the on-resistance value RSW40*a* and the on-resistance value RSW301*b* is set to be larger than the on-resistance value RSW40*b*, it is possible to suppress the variation in transient characteristics of the analog output signal due to the variation in the on-resistance values RSW40*a* and RSW40*b*.

According to the fifth embodiment, it is possible to suppress the occurrence of a distortion without adding a new element to the digital-analog converter. Since it is not necessary to increase the size of the MOS transistors constituting the switches, an increase in noise source due to the increase in switch size does not occur.

The fifth embodiment is not limited to the above-mentioned configuration. That is, in the fifth embodiment, the control signals may be set to slowly rise so that the on-resistance value RSW301 of the switch 301 is larger than the on-resistance value RSW40 of the switch unit SWu40 only just after the turning-on thereof, as shown in FIG. 7 in the second embodiment. In the fifth embodiment, two switches may be disposed in parallel instead of the switch 301*a*, or two switches may be disposed in parallel instead of the switch 301*b*. As shown in FIG. 10 according to the third embodiment, by more slowly turning on one MOS transistor of one of the two switches than the MOS transistor of the other switch, the on-resistance value of the switch can be set to increase just after the switch is turned on.

In the fifth embodiment, plural switches may be provided instead of the switch 301*a* and plural switches maybe provided instead of the switch 301*b*, like in the fourth embodiment.

In this configuration, by sequentially turning on the plural switches at slightly-shifted timings, the combined on-resistance value of the plural switches provided instead of the switch 301*a* can be set to be larger than that of the switch unit SWu40*a*. The combined on-resistance value of the plural switches provided instead of the switch 301*b* can be set to be larger than that of the switch unit SWu40*b*.

In the fifth embodiment, the integrating capacitive elements 603*a* and 603*b* may not be disposed between the output terminal and the inverting input terminal of the differential operational amplifier 1101. In this case, the summing node switches 301*a* and 301*b* may be replaced with a resistor and the value of the resistor may be set to be larger than the on-resistance values RSW40*a* and RSW40*b*.

INDUSTRIAL APPLICABILITY

The present invention can be suitably used for a digital-analog converter and a sampling and holding circuit applied to the field requiring that a distortion of an analog output signal after conversion is removed with high accuracy, like in the field of audio.

REFERENCE SIGNS LIST

70: sampling capacitive element unit
100, 700, 900, 1000: digital-analog converter
101, 102, . . . , 10N, 141, 142, . . . , 14N, 201, 301, 301*a*,
301*b*, 302, 303: switch
501: operational amplifier
111, 112, . . . , 11N: sampling capacitive element
200*a*, 200*b*: digital-analog conversion section
601, 602: power source
603: integrating capacitive element
1101: differential operational amplifier

The invention claimed is:

1. A digital-analog converter comprising:
a sampling capacitive element sampling a digital signal input from the outside;
an operational amplifier;
a summing node switch unit capable of electrically connecting and disconnecting one end of the sampling capacitive element and an inverting input terminal of the operational amplifier; and
a feedback switch unit disposed between an output terminal of the operational amplifier and the other end other than the one end of the sampling capacitive element and capable of electrically connecting and disconnecting the output terminal of the operational amplifier and the other end of the sampling capacitive element,
wherein the summing node switch unit and the feedback switch unit include a MOS transistor, and an on-resistance value of the MOS transistor for a summing node switch included in the summing node switch unit is set to be larger than the on-resistance value of the MOS transistor for a feedback switch included in the feedback switch unit until a predetermined time elapses from a time point where the one end of the sampling capacitive element and the inverting input terminal of the operational amplifier are electrically connected to each other.

2. The digital-analog converter according to claim 1, wherein a signal for turning on the MOS transistor for the summing node switch rises more slowly than a signal for turning on the MOS transistor for the feedback switch.

3. The digital-analog converter according to claim 1, wherein the summing node switch unit includes a plurality of the MOS transistors for the summing node switch, and a signal for turning on at least a part of the plurality of MOS transistors for the summing node switch rises more slowly than a signal for turning on the other MOS transistors for the summing node switch.

4. The digital-analog converter according to claim 1, wherein the summing node switch unit includes a plurality of the MOS transistors for the summing node switch, and a signal for controlling the plurality of MOS transistors for the summing node switch sequentially turns on the plurality of MOS transistors for the summing node switch at different timings.

5. A digital-analog converter comprising:
a sampling capacitive element sampling a digital signal input from the outside;
an operational amplifier;
a summing node switch unit capable of electrically connecting and disconnecting one end of the sampling capacitive element and an inverting input terminal of the operational amplifier; and
a feedback switch unit disposed between an output terminal of the operational amplifier and the other end other than the one end of the sampling capacitive element and capable of electrically connecting and disconnecting the output terminal of the operational amplifier and the other end of the sampling capacitive element,
wherein the summing node switch unit and the feedback switch unit includes a MOS transistor, and an on-resistance value of the MOS transistor included in the summing node switch unit is set to be larger than the on-resistance value of the MOS transistor included in the feedback switch unit.

6. A digital-analog converter comprising:
a plurality of input terminals to which digital signals are input, respectively;
a plurality of sampling capacitive elements disposed to correspond to the plurality of input terminals and sampling charges of the digital signals input from the corresponding input terminals;
a plurality of first switches disposed between the input terminals and the sampling capacitive elements to correspond to the plurality of input terminals and capable of electrically connecting the input terminals and one ends of the sampling capacitive elements;
a second switch capable of electrically connecting the other ends other than the one ends of the plurality of sampling capacitive elements and a first reference voltage source;
an operational amplifier including an inverting input terminal, a non-inverting input terminal electrically connected to a second reference voltage source, and an output terminal outputting an analog signal;
a third switch capable of electrically connecting the one ends of the plurality of sampling capacitive elements and the inverting input terminal;
an integrating capacitive element disposed between the non-inverting input terminal and the output terminal of the operational amplifier and charged with the charges sampled by the sampling capacitive elements; and
a fourth switch disposed between nodes between the plurality of first switches and the sampling capacitive elements corresponding to the first switches and the output terminal and capable of electrically connecting the first switches and the output terminal,
wherein the third switch and the fourth switch include a MOS transistor, and an on-resistance value of the third switch is larger than an on-resistance value of the fourth switch only by a predetermined time from a time point when the third switch and the fourth switch are turned on.

7. A digital-analog converter comprising:
a plurality of input terminals to which digital signals are input, respectively;
a plurality of sampling capacitive elements disposed to correspond to the plurality of input terminals and sampling charges of the digital signals input from the corresponding input terminals;
a plurality of first switches disposed between the input terminals and the sampling capacitive elements to correspond to the plurality of input terminals and capable of electrically connecting the input terminals and one ends of the sampling capacitive elements;
a second switch capable of electrically connecting the other ends other than the one ends of the plurality of sampling capacitive elements and a first reference voltage source;
an operational amplifier including an inverting input terminal, a non-inverting input terminal electrically connected to a second reference voltage source, and an output terminal outputting an analog signal;
a third switch capable of electrically connecting the one ends of the plurality of sampling capacitive elements and the inverting input terminal;
an integrating capacitive element disposed between the non-inverting input terminal and the output terminal of the operational amplifier and charged with the charges sampled by the sampling capacitive elements; and
a fourth switch disposed between nodes between the plurality of first switches and the sampling capacitive elements corresponding to the first switches and the output terminal and capable of electrically connecting the first switches and the output terminal, wherein the third switch and the fourth switch include a MOS transistor, and an on-resistance value of the MOS transistor included in the third switch is larger than an on-resistance value of the MOS transistor included in the fourth switch.

8. A control method for a digital-analog converter comprising:
   a sampling period in which a digital signal input from the outside is sampled by a sampling capacitive element; and
   an integrating period in which one end of the sampling capacitive element and an input terminal of an operational amplifier are electrically connected to each other by a summing node switch unit capable of electrically connecting and disconnecting the one end of the sampling capacitive element and the input terminal of the operational amplifier and a feedback switch unit that is capable of electrically connecting and disconnecting an output terminal of the operational amplifier and the other end of the sampling capacitive element, wherein an on-resistance value of a MOS transistor included in the summing node switch unit is set to be larger than an on-resistance value of a MOS transistor included in the feedback switch unit in an initial period of the integrating period.

9. The control method of a digital-analog converter according to claim 8, wherein the initial period is a period until a predetermined time elapses from a time point when the one end of the sampling capacitive element and the input terminal of the operational amplifier are electrically connected to each other.

* * * * *